(12) United States Patent
Dicola et al.

(10) Patent No.: US 10,484,217 B2
(45) Date of Patent: Nov. 19, 2019

(54) METHOD OF DETECTING FSK-MODULATED SIGNALS, CORRESPONDING CIRCUIT, DEVICE AND COMPUTER PROGRAM PRODUCT

(71) Applicants: STMicroelectronics Design and Application s.r.o., Prague (CZ); STMicroelectronics S.r.l., Agrate Brianza (IT)

(72) Inventors: Eusebio Dicola, Messina (IT); Elena Salurso, Mascalucia (IT); Jan Milsimer, Pilsen (CZ)

(73) Assignees: STMICROELECTRONICS DESIGN AND APPLICATION S.R.O., Prague (CZ); STMICROELECTRONICS S.R.L., Agrate Brianza (IT)

( * ) Notice: Subject to any disclaimer, the term of this patent is extended or adjusted under 35 U.S.C. 154(b) by 309 days.

(21) Appl. No.: 15/606,979

(22) Filed: May 26, 2017

(65) Prior Publication Data

US 2018/0131544 A1 May 10, 2018

(30) Foreign Application Priority Data

Nov. 4, 2016 (IT) .......................... 102016000111351

(51) Int. Cl.
*H04L 27/144* (2006.01)
*H04L 27/156* (2006.01)
(Continued)

(52) U.S. Cl.
CPC ........ *H04L 27/144* (2013.01); *G01R 29/0273* (2013.01); *H04L 1/206* (2013.01);
(Continued)

(58) Field of Classification Search
CPC ..... H04L 27/156; H04L 27/10; H04L 25/069; H04L 1/1835; H04L 27/1563; H04L 1/206; H04L 27/144; G01R 29/0273
(Continued)

(56) References Cited

U.S. PATENT DOCUMENTS 4,551,846 A 11/1985 Takeda et al.
4,652,775 A 3/1987 Daudelin
(Continued)

FOREIGN PATENT DOCUMENTS

GB 2 264 614 A 9/1993

OTHER PUBLICATIONS

Italian Search Report and Written Opinion of the Italian Ministry of Economic Development, dated Jul. 25, 2017, for Italian Application No. IT 201600111351, 11 Pages.

*Primary Examiner* — Arnold M Kinkead
(74) *Attorney, Agent, or Firm* — Seed IP Law Group LLP

(57) ABSTRACT

An occurrence of a first set of n periods of a frequency-shift-keying (FSK)-modulated waveform is counted, where n is an integer number. The n periods of the FSK-modulated waveform in the first set have a first time duration. An occurrence of a second set of n periods of the waveform is counted. The n periods of the waveform in the second set have a second time duration. The first time duration is determined based on the counting of the first set of n periods. The second time duration is determined based on the counting of the second set of n periods. A difference between the first time duration and the second time duration is compared to a threshold. Changes in frequency of the waveform are detected based on the comparing of the difference between the first time duration and the second time duration to the threshold.

26 Claims, 3 Drawing Sheets

(51) Int. Cl.
*H04L 27/10* (2006.01)
*G01R 29/027* (2006.01)
*H04L 1/20* (2006.01)
*H04L 1/18* (2006.01)
*H04L 25/06* (2006.01)

(52) U.S. Cl.
CPC ............ *H04L 27/10* (2013.01); *H04L 27/156* (2013.01); *H04L 27/1563* (2013.01); *H04L 1/1835* (2013.01); *H04L 25/069* (2013.01)

(58) Field of Classification Search
USPC ....... 375/272, 274, 275, 303, 305, 334, 335, 375/336; 332/109, 101, 100
See application file for complete search history.

(56) References Cited

U.S. PATENT DOCUMENTS

| | | | | |
|---|---|---|---|---|
| 4,785,255 A | | 11/1988 | Lucak et al. | |
| 5,311,556 A | * | 5/1994 | Baker ................. | H04L 27/1563 329/303 |
| 5,339,333 A | * | 8/1994 | Zehngut ............. | H04L 27/1566 329/301 |
| 5,818,881 A | * | 10/1998 | Guiffant ................. | H03D 3/04 375/334 |
| 9,225,568 B1 | | 12/2015 | Mei et al. | |

* cited by examiner

METHOD OF DETECTING FSK-MODULATED SIGNALS, CORRESPONDING CIRCUIT, DEVICE AND COMPUTER PROGRAM PRODUCT

BACKGROUND

Technical Field

The description relates to detecting FSK-modulated signals.

One or more embodiments may be applied to arrangements where information is exchanged between two devices. A "charger" device and a "charged" device exchanging information in order to regulate/adjust a charging process in, e.g., a wireless charger may be exemplary of such an arrangement.

Description of the Related Art

Frequency modulation (FM) involves a variation of the frequency of a modulated signal as a function of a modulating signal, such as, e.g., an information-carrying data signal.

A common type of frequency modulation is Frequency Shift Keying (FSK). For instance, in two-level FSK (2-FSK) two different frequencies may correspond to two different binary levels (e.g., "0" and "1").

The frequency spectrum of the corresponding modulated signal includes a plurality of lines at locations dictated by the deviation frequency $\Delta f$ and the modulation speed fc, as expressed e.g., in bauds.

Various types of circuits may be used for demodulating an FSK-modulated signal.

A basic detection approach may rely on the detection of passages through zero (zero-crossings) of the modulated signal.

A corresponding circuit may include a (baseband) filter, a threshold operational amplifier, a derivative block, a rectifier diode, a monostable circuit, a low-pass filter and a Schmitt Trigger. In such an arrangement, the received signal is passed through a band-pass filter to remove out-of-band noise. The filtered signal is fed to a threshold comparator that detects the number of zero crossings. The derivative block and a rectifier (e.g., a diode) may generate positive spikes at the rising edges of the square wave signal output from the comparator. A monostable circuit may then generate constant duration pulses at the instances where the spikes occur. The pulses so generated are then low-pass filtered and passed on to a trigger circuit which is configured to detect the received signal as "1" or "0" according to whether the low-pass filtered signal is, e.g., above and below, respectively, a detection threshold.

Correct demodulation is facilitated by the absence of phase "jumps" in the FSK signal when passing from one frequency to another: such jumps may in fact militate against determining the exact moment where variation of the modulated signal occurred.

An alternative detection method may include using a processing device such as, e.g., a DSP core, which may compute the frequency of the FSK-modulated signal (e.g., via DFT calculation or the like), followed by filtering to remove noise; frequency variations are then evaluated in order to detect the information-carrying signal.

Arrangements as discussed in the foregoing may suffer from various disadvantages including, e.g., circuit complexity (also in terms of a silicon area in the case of integrated circuits) and cost and exhibit an intrinsic weakness with respect to phase-variations ("jumps") when transitioning from a frequency to another.

Documents such as U.S. Pat. No. 9,225,568 B1 suggest using a counter for timing a fixed number of FSK-cycles. The frequency of the received signal may then be determined by comparing the count values with a determined threshold. Comparing the received number with an expected number makes it possible to discriminate between, e.g., two modulation frequencies f0 and f1.

BRIEF SUMMARY

Despite the extensive activity in that area, improvement may be desired, e.g., as regards one or more of the following:
    robustness against phase jumps and possible frequency drifts, e.g., in the carrier signal which is FSK-modulated;
    the capability of operating in a MFSK (Multiple Frequency-Shift Key) scenario, involving multi-level modulating signals (e.g., 4-FSK, 8-FSK, . . . ); and/or
    the capability of operating with different communication standards, such as, by way of example, the Qi 1.2 communication protocol and the PMA communication protocol.

In an embodiment, a method of detecting a FSK-modulated waveform wherein the period of the FSK-modulated waveform varies as a function of the level of a digital modulating signal, comprises: counting the occurrence of a first set of n periods of the FSK-modulated waveform, said n periods of said FSK-modulated waveform in said first set having a first time duration, counting the occurrence of a second set of n periods of said FSK-modulated waveform, said n periods of said FSK-modulated waveform in said second set having a second time duration, detecting and comparing said first time duration and said second time duration, and detecting a change in the frequency of said FSK-modulated waveform indicative of a change in the level of said digital modulating signal as a result of said comparison indicating a difference between said first time duration and said second time duration reaching a detection threshold. In an embodiment, said first set of n periods and said second set of n periods are neighboring sets of periods in said FSK-modulated waveform. In an embodiment, the method includes cyclically counting the occurrence of sets of n periods of said FSK-modulated waveform over subsequent time windows wherein: said first set of n periods includes a set of n periods of said FSK-modulated waveform during a current time window, and said second set of n periods includes a set of n periods of said FSK-modulated waveform during a previous time window. In an embodiment, the method includes making said number n of periods of said FSK-modulated waveform selectively adjustable. In an embodiment, the method includes making said difference threshold selectively adjustable. In an embodiment, the method includes recovering said digital modulating signal as a function of the changes in the frequency of said FSK-modulated waveform detected as a result of said comparison. In an embodiment, the method includes buffering the information bits conveyed by said recovered digital modulating signal. In an embodiment, the method includes generating interrupt signals for at least partly discontinuing detection as a result of reception of said FSK-modulated waveform being discontinued. In an embodiment, the method includes generating interrupt signals for at least partly discontinuing detection as result of one of: the number of said buffered bits reaching a threshold value, the buffered bits having filled a respective buffer.

In an embodiment, a circuit comprises: counting circuitry configured to count the occurrence of sets of n periods in a FSK-modulated waveform, wherein the period of said FSK-modulated waveform varies as a function of the level of a digital modulating signal, the counting circuitry is configured to: i) count the occurrence of a first set of n periods of said FSK-modulated waveform, said n periods of said FSK-modulated waveform in said first set having a first time duration, ii) count the occurrence of a second set of n periods of said FSK-modulated waveform, said n periods of said FSK-modulated waveform in said second set having a second time duration, a frequency change detection circuit coupled with said counting circuitry to receive therefrom at least one signal indicative of said first time duration and said second time duration, comparing said first time duration and said second time duration and generating at least one detection signal indicative of the occurrence of variations in the frequency of said FSK-modulated waveform as a result of the difference between said first time duration and said second time duration reaching a detection threshold. In an embodiment, the circuit is an FSK-demodulator including a bit decoder coupled with said circuit to receive therefrom said at least one detection signal indicative of the occurrence of variations in the frequency of said FSK-modulated waveform, the bit decoder configured to recover from said at least one detection signal the information bits conveyed by said digital modulating signal. In an embodiment, the FSK-demodulator includes a buffer to store a plurality of information bits conveyed by said digital modulating signal recovered from said at least one detection signal. In an embodiment, said decoder is configured to decode at least one of a differential by-phase encoded signal and a Manchester-encoded signal.

In an embodiment, a method comprises: counting an occurrence of a first set of n periods of a frequency-shift-keying (FSK)-modulated waveform, where n is an integer number, said n periods of said FSK-modulated waveform in said first set having a first time duration, wherein a period of the FSK-modulated waveform varies as a function of a level of a digital modulation signal; counting an occurrence of a second set of n periods of said FSK-modulated waveform, said n periods of said FSK-modulated waveform in said second set having a second time duration; determining, based on the counting of the first set of n periods, the first time duration; determining, based on the counting of the second set of n periods, the second time duration; comparing a difference between said first time duration and said second time duration to a threshold; and detecting a change in a frequency of said FSK-modulated waveform indicative of a change in the level of said digital modulating signal based on the comparing of the difference between the first time duration and the second time duration to the threshold. In an embodiment, said first set of n periods and said second set of n periods are neighboring sets of periods in said FSK-modulated waveform. In an embodiment, the method comprises: cyclically counting occurrences of sets of n periods of said FSK-modulated waveform over sequential time windows wherein: said first set of n periods includes a set of n periods of said FSK-modulated waveform during a current time window, and said second set of n periods includes a set of n periods of said FSK-modulated waveform during a previous time window. In an embodiment, the method comprises: adjusting said number n of periods of said FSK-modulated waveform. In an embodiment, the method comprises: adjusting said threshold. In an embodiment, the method comprises: recovering said digital modulation signal as a function of detected changes in the frequency of said FSK-modulated waveform based on a series of comparisons of differences between durations of sets of n periods to the threshold. In an embodiment, the method comprises: buffering information bits of said recovered digital modulation signal. In an embodiment, the method comprises: detecting a discontinuation of reception of the FSK-modulated waveform; and generating an interrupt signal in response to the detection of the discontinuation. In an embodiment, the method comprises: generating an interrupt signal in response to at least one of: a number of said buffered bits reaching a threshold number of bits; and a buffer overflow.

In an embodiment, a device comprises: one or more memories; and frequency-shift detection circuitry, which, in operation: counts occurrences of sets of n periods of a received frequency-shift-keying (FSK)-modulated waveform, where n is an integer number; determines, based on the counting, time durations corresponding to respective sets of n periods; compares differences between time durations corresponding to respective sets of n periods to a threshold difference; and generates one or more signals indicative of variations in frequency of the FSK-modulated waveform based on the comparing of the differences between time durations to the threshold difference. In an embodiment, the frequency-shift detecting circuitry, in operation, compares differences between time durations of neighboring sets of n periods in said FSK-modulated waveform to the threshold difference. In an embodiment, the frequency-shift detecting circuitry, in operation: cyclically counts occurrences of sets of n periods of said FSK-modulated waveform over sequential time windows wherein: a first set of n periods includes a set of n periods of said FSK-modulated waveform during a current time window; a second set of n periods includes a set of n periods of said FSK-modulated waveform during a previous time window; and a difference between a time duration corresponding to the first set of n periods and a time duration corresponding to the second set of n periods is compared to the threshold difference. In an embodiment, n is adjustable. In an embodiment, the threshold difference is adjustable. In an embodiment, the device comprises: decoding circuitry, which, in operation, recovers a digital modulation signal based on the one or more signals indicative of variations in frequency of the FSK-modulated waveform generated in response to a series of comparisons of differences between durations corresponding to sets of n periods to the threshold difference. In an embodiment, wherein the frequency-shift detecting circuitry, in operation, recovers a digital modulation signal based on the one or more signals indicative of variations in frequency of the FSK-modulated waveform generated in response to a series of comparisons of differences between durations corresponding to sets of n periods to the threshold difference. In an embodiment, the one or more memories comprise a buffer, which, in operation, buffers information bits of said recovered digital modulation signal. In an embodiment, the frequency-shift detecting circuitry, in operation: detects discontinuations of reception of the FSK-modulated waveform; and generates an interrupt signal in response to detection of a discontinuation. In an embodiment, the frequency-shift detecting circuitry, in operation, generates an interrupt signal in response to at least one of: a number of said buffered bits reaching a threshold number of bits; and a buffer overflow.

In an embodiment, a system comprises: receiving circuitry, which, in operation: counts occurrences of sets of n periods of a received frequency-shift-keying (FSK)-modulated waveform, where n is an integer number; determines, based on the counting, time durations corresponding to respective sets of n periods; compares differences between time durations corresponding to respective sets of n periods to a threshold difference; and generates one or more signals indicative of variations in frequency of the FSK-modulated waveform based on the comparing of the differences between time durations to the threshold difference; and decoding circuitry, which, in operation, recovers a digital modulation signal based on the one or more signals indicative of variations in frequency of the FSK-modulated waveform generated in response to a series of comparisons of differences between durations corresponding to sets of n periods to the threshold difference. In an embodiment, the system includes a buffer, which, in operation, stores information bits of the recovered digital modulation signal. In an embodiment, the decoding circuitry, in operation, decodes at least one of a differential by-phase encoded signal and a Manchester-encoded signal. In an embodiment, the system comprises: power control circuitry, which, in operation, controls a charging process based on the recovered digital modulation signal.

In an embodiment, a non-transitory, computer-readable medium's contents cause a signal processing circuit to perform a method, the method comprising: counting occurrences of sets of n periods of a received frequency-shift-keying (FSK)-modulated waveform, where n is an integer number; determining, based on the counting, time durations corresponding to respective sets of n periods; comparing differences between time durations corresponding to respective sets of n periods to a threshold difference; and generating one or more signals indicative of variations in frequency of the FSK-modulated waveform based on the comparing of the differences between time durations to the threshold difference. In an embodiment, the method comprises: recovering a digital modulation signal based on the one or more signals indicative of variations in frequency of the FSK-modulated waveform generated in response to a series of comparisons of differences between durations corresponding to sets of n periods to the threshold difference. In an embodiment, the method comprises: controlling a charging process based on the recovered digital modulation signal. In an embodiment, the signal processing circuit comprises one or more memories and one or more processing cores.

One or more embodiments may relate to a method as disclosed herein, a corresponding circuit (e.g., a FSK detector), a corresponding device (e.g., a FSK demodulator) and a corresponding computer program product loadable into the memory of at least one processing device and including software code portions for executing a method as disclosed herein when the product is run on at least one processing device. As used herein, reference to such a computer program product is understood as being equivalent to reference to a computer-readable medium containing instructions for controlling the processing system in order to co-ordinate implementation of the method according to one or more embodiments. Reference to "at least one processor device" is intended to highlight the possibility for one or more embodiments to be implemented in modular and/or distributed form.

One or more embodiments may involve detecting the difference between two frequencies used for modulation, e.g., the difference between a frequency currently detected and a frequency previously detected.

Consequently, operation of one or more embodiments may not be directly linked to the (absolute value of) the frequencies used, which facilitates decoding a modulating signal also in an MFSK scenario.

One or more embodiments may exhibit an intrinsic robustness against frequency shifts and/or phase jumps.

One or more embodiments may operate effectively in connection with, e.g., transmission protocols involving a sort of differential operation, e.g., where the frequency generated during a certain time interval is linked to the frequency generated in a previous time interval, so that the information to be detected lies in the difference between these two frequencies and not in the sequence of the absolute frequency values which are transmitted/received.

One or more embodiments may facilitate detecting a Qi signal (which is differentially encoded by using a bi-phase system), as well as a PMA signal based on the use of a Manchester code.

In contrast with conventional approaches for detection of FSK-modulated signals (wherein the—absolute—values of the frequencies received are estimated and a corresponding bit sequence re-constructed on the basis of the sequence of the frequencies received and the modulation rule, applied in a complementary way with respect to the modulator) one or more embodiments may re-construct the sequence of the bits conveyed in the digital modulated signal directly, namely by exploiting the frequency transitions, which by themselves already include the binary information transmitted in so far as this is applied differentially.

BRIEF DESCRIPTION OF THE SEVERAL VIEWS OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. More-over, particular conformations, structures, or characteristics may be combined in any adequate way in one or more embodiments.

The references used herein are provided merely for convenience and hence do not define the extent of protection or the scope of the embodiments.

Figure 1:
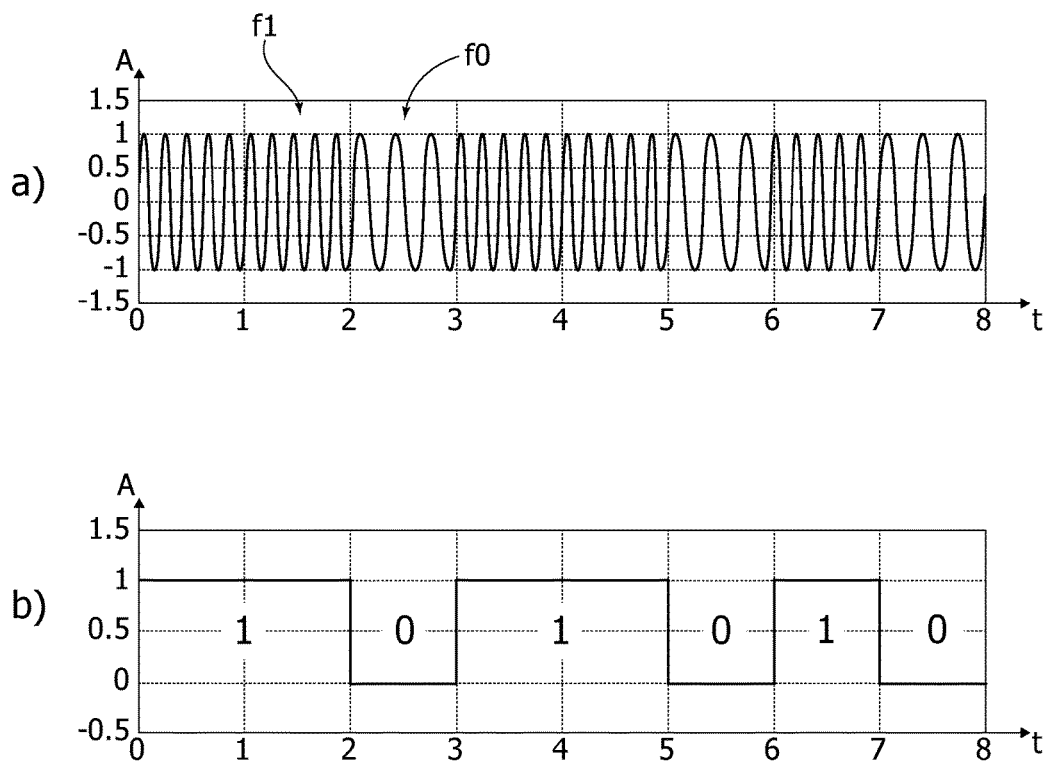
FIG. 1, including two portions indicated a) and b) respectively, is exemplary of FSK-modulation.

The upper portion, designated a), of FIG. 1 is exemplary of the possible time behavior of a (sinusoidal) signal which is FSK-modulated as a function of a digital modulating signal having the time behavior exemplified in the lower portion, designated b), of FIG. 1.

Specifically, FIG. 1 is exemplary—in a non-limiting sense of the embodiments—of two-level FSK-modulation (2-FSK) wherein the frequency of the FSK-modulated signal (portion a)) is switched between a "low" value f0 and a "high" value f1 as a function of the logical value of the modulating signal (portion b) switching between "0" and "1".

In both portions of FIG. 1, the abscissa scale indicates time, and the ordinate scale indicates the amplitude A (in arbitrary units).

For instance, while the representation of FIG. 1 assumes that:
a transition from frequency f0 to frequency f1 in the FSK-modulated signal corresponds to a transition from "0" to "1" in the (digital) modulating signal, and
a transition from frequency f1 to frequency f0 in the FSK-modulated signal corresponds to a transition from "1" to "0" in the modulating signal,
the opposite may apply.

Similarly, FSK-modulation may involve using more than two frequencies, e.g., f0, f1, f2, f3, thus permitting multi-level modulation, e.g., "00"→f0, "01"→f1, "10"→f2, "11"→f3 in the case of 4-FSK.

The foregoing corresponds to well-known principles in signal theory, thus making it unnecessary to provide a more detailed description herein.

The representation of FIG. 1 is thus generally exemplary of an FSK-modulated waveform, wherein the frequency (that is, the period) of the modulated waveform varies as a function of the level of a digital modulating signal.

Figure 2:
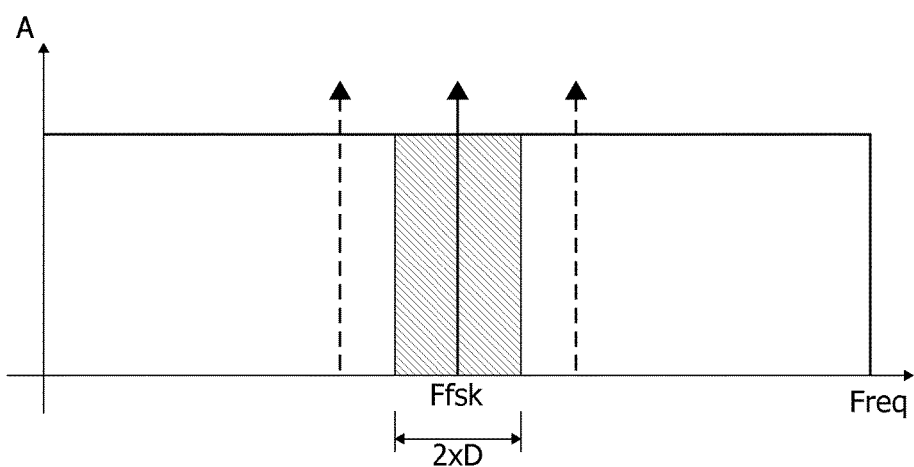
FIG. 2 is a schematic representation of an embodiment of a detection window to detect a frequency change in an FSK-modulated signal.

FIG. 2 is exemplary of a possible criteria for detecting an FSK-modulated signal (see, e.g., the upper portion a) in FIG. 1) as represented as a function of frequency (abscissa scale).

An area (Dzone area) may be defined around a currently received frequency Ffsk representative of a window of a width 2×D (e.g., between −D and +D around Ffsk), such that reception of frequency outside the window in question (a window symmetrical around Ffsk is exemplified for the sake of simplicity, this feature being otherwise non limiting) may be held to correspond to a change in frequency of the FSK-modulated waveform indicative of a level change (e.g., "0"→"1" or "1"→"0") in the modulating signal which is to be recovered at the detector side.

Figure 3:
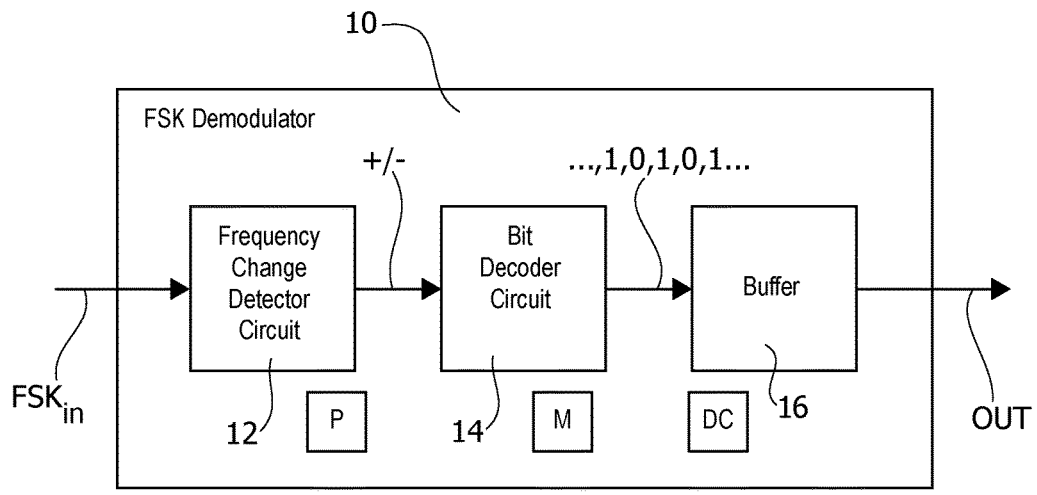
FIG. 3 is a general functional block diagram exemplary of one or more embodiments of an FSK demodulator.

The block diagram of FIG. 3 is exemplary of a possible arrangement of an FSK-demodulator 10 according to one or more embodiments.

For instance, in one or more embodiments, an FSK-modulated incoming signal $FSK_{in}$ (see, e.g., portion a) of FIG. 1) may be fed into a frequency change detection block 12 where the FSK-modulated signal $FSK_{in}$ is analyzed to detect a change in its frequency.

The detected signal output from the frequency change detection block 12 may be fed to a bit decoding block 14 (including, e.g., a Finite State Machine—FSM) to evaluate subsequent frequency changes (e.g., positive or negative +/− between two frequencies f0 and f1) and decode the modulating signal (e.g., bits "0" and "1", by referring to the example in the lower portion of FIG. 1) in order to produce a decoded received bit sequence (e.g., . . . 1, 0, 1, 0, 1, . . . ).

In one or more embodiments, the decoded bits may be stored in a buffer 16 with a view to producing an output signal OUT for use in a device coupled to the FSK-demodulator 10. A charger/charged device as exemplified in the introductory portion of the description may be exemplary of such use or devices.

It will be otherwise understood that the representation of FIG. 3 is merely exemplary in so far as, e.g., in one or more embodiments the buffer 16 may be dispensed with.

A FSK-demodulator as exemplified in FIG. 3 may be used for demodulating a variety of FSK-modulated signals, such as, e.g., signals encoded according to the Qi or PMA protocols already mentioned.

One or more embodiments, as exemplified in FIG. 3 may be controlled/programmed, e.g., by means of an external processing unit, such as a microprocessor unit or MPU.

For instance, in one or more embodiments the possibility may exist of generating interrupts for such a unit every time a change in the frequency of the incoming signal $FSK_{in}$ occurs (by leaving the related processing to software-based modules).

In one or more embodiments the possibility may exist of receiving, e.g., Qi or PMA data and issue an interrupt to the processing unit (e.g., only) when a certain number of bits have been received.

In one or more embodiments, the processor may store in its configuration registers a type of demodulation as required, the number of received bits to be stored in the buffer and other possible parameters involved in a decoding algorithm (which may be then performed, e.g., via hardware IPs).

It will be appreciated that one or more embodiments may be able to decode signals in compliance with protocols such as Qi/PMA by operating (e.g., solely) on the output of the frequency change detector 12 which detects frequency variations.

As illustrated, the FSK demodulator 10 of FIG. 3 includes one or more processors P, one or more memories M and one or more discrete circuits DC, which may be used alone or in various combinations to implement the functions of the FSK demodulator 10.

Figure 4:
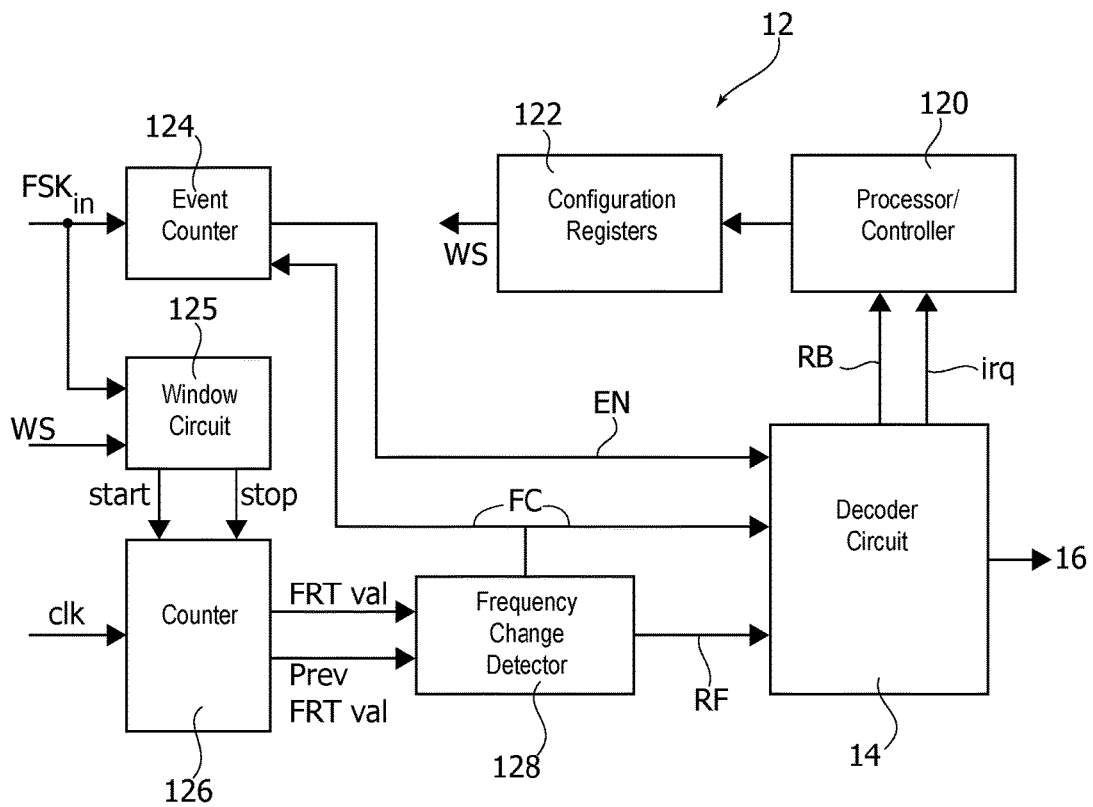
FIG. 4 is a block diagram of one or more embodiments.

The block diagram of FIG. 4 is exemplary of a possible layout of an embodiment of the FSK demodulator circuit 12 of FIG. 3 and its possible cooperation with the bit decoder circuit 14.

FIG. 4 also shows the possible presence, in one or more embodiments, of an (e.g., external) processing unit 120 such as, e.g., a microprocessor unit or controller (MPU) as discussed in the foregoing with associated configuration registers 122. The controller 120 may, for example, control a power charging process or other processes based on a decoded signal.

In FIG. 4, reference 124 denotes an "event" counter module or circuit receiving as an input the FSK-modulated signal $FSK_{in}$ and a frequency change signal FC and producing an event number signal EN. Such an event counter 124 may be included in one or more embodiments in order to count the number of pulses/waveforms of the modulated input signal $FSK_{in}$ between two frequency changes. In one or more embodiments such length information may be exploited in order to facilitate correct demodulation of the received bits as discussed in the following.

In FIG. 4, reference 125 denotes a "window" counter module or circuit which may be driven by the controller 120 (e.g., via the registers 122) and which may receive as an input the FSK-modulated signal $FSK_{in}$, a window size signal WS (possibly provided by the processing unit or controller 120) and produce a start and stop signal to a counter 126.

In one or more embodiments, the counter 126 may be a free running counter clocked by an input clock signal clk, coupled with the window counter 125 and configured for (cyclically) issuing input signals indicative of a "current" count value FRT val and of a "previous" count value, Prev FRT val.

In FIG. 4, reference 128 denotes a frequency change detection circuit which receives the signals FRT val and Prev FRT val as inputs and provides a frequency change signal FC to the event counter 124 and to the decoding unit or circuit 14.

In one or more embodiments a received frequency signal RF may be supplied to the bit decoding unit 14, e.g., in order to facilitate certain decoding processes as discussed in the following.

In one or more embodiments the bit decoding unit 14 may provide feedback to the processing unit 120 on the received (decoded) bits including, e.g., a signal RB and a signal irq to be discussed in the following.

In one or more embodiments, a change in frequency of the FSK-modulated signal (upper portion a) in FIG. 1) due to a change or transition in the level(s) of the modulating signal (lower portion b) in FIG. 1) can be detected by considering a "window" including a number n of periods or cycles of the FSK-modulated signal $FSK_{in}$.

In one or more embodiments, this may occur with a high sensitivity, namely with the capability of detecting even "thin" differences between two received frequencies.

In one or more embodiments the number n of periods or cycles may be rendered user-configurable (e.g., between 1 and 32), e.g., via the signal WS as possibly provided by the processor 120 and configuration register 122.

In one or more embodiments, during such a window two counts (see, e.g., steps 1000 and 1002 in the flow chart of FIG. 6) may be performed by the counter 126 under the control of the window counter 125.

During the first count (step 1000 in the flow chart of FIG. 6), the time duration of a first set of n periods or cycles (that is the time interval required to receive n waveforms or pulses of the FSK-modulated signal) is determined.

During the second count (step 1002 in the flow chart of FIG. 6) the time duration of a second, neighboring (e.g., subsequent) set of n subsequent periods or cycles is determined.

The time duration/interval determined at each events gives an indication of the (average) period of the FSK-modulated signal during the corresponding window.

For instance, by assuming (for the sake of simplicity and ease of understanding) that the frequency of the FSK-modulated signal changes from a frequency f1 to a frequency f0 due to the modulating signal transitioning from "1" to "0" (see, e.g., FIG. 1) with—by way of example—$f_1 > f0$:
  the first count of n pulses (waveforms) will have a duration of n times the period T1=1/f1 of the FSK-modulated waveform at the first frequency f1;
  the second count of n pulses (waveforms) will have a duration of n times the period T0=1/f0 of the FSK-modulated wave form at the second frequency f0.

Figure 6:
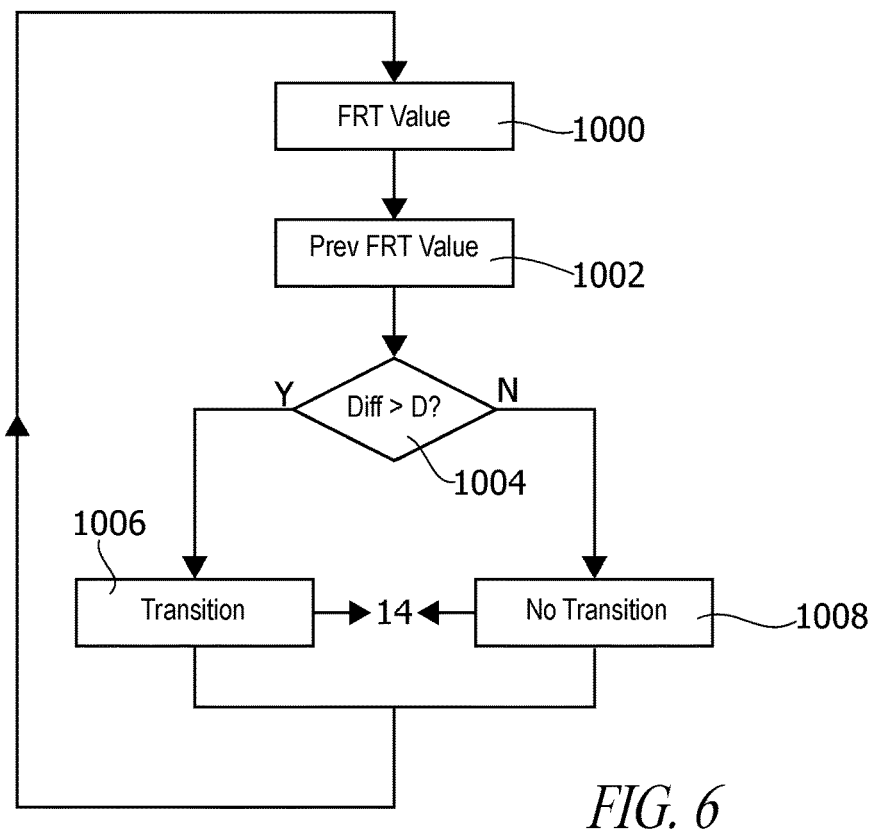
FIG. 6 is a flow chart exemplary of possible operation of embodiments.

The two signals FRT val and Prev FRT val (corresponding to the subsequent counts 1000 and 1002 in the flow chart of FIG. 6) may then be compared in the frequency change detector 128 (step 1004 of the flow chart of FIG. 6) in order to ascertain whether the two counts are equal or differ.

If the two counts differ (e.g., more than certain sensitivity threshold such as D in FIG. 2, which in the exemplary case considered in the foregoing may be due to a transition of the modulating signal from "1" to "0") in a step 1006 a variation in the modulating signal will be detected by the frequency change detector 128.

If, conversely, the two counts are equal (e.g., differ less than certain sensitivity threshold such as D in FIG. 2) in a step 1008 a determination will be made that no changes/transitions have occurred in the modulating signal (see for instance the situation depicted at the center of both portions a) and b) of FIG. 1) due, e.g., to the frequency of the FSK-modulated signal remaining at the value f1 as a result of the modulating signal maintaining the "1" logical value.

The comparison between the two counts performed, e.g., in the frequency detector 128 (step 1004 of the flow chart of FIG. 6) essentially corresponds to the basic concept represented in FIG. 2, that is:
  no transition in the modulating signal is detected as long as the changes/variations in the frequency of the FSK-modulated signal remain within the Dzone (2×D) area.
  a transition in the modulating signal is detected as a result of a variation in the frequency of the FSK-modulated signal outside the Dzone area.

Once frequency change detection (change/no change) has been effected in steps 1006 or 1008, operation may return "upstream" of the count steps 1000, 1002 within the framework of a cyclical operation where the counts 1000 and 1002 may correspond to a counting n periods or pulses of the FSK-modulated signal over two subsequent time windows or "events" where one of the two counts (e.g., count 1000) is representative of a "previous" event—signal Prev FRT val—and the other count (e.g., count 1002) is representative of a new, current count, with the "current" count at a certain event j becoming the "previous" count for a subsequent event j+1.

In one or more embodiments, any such count may provide an indication of the average period—thus frequency—of the FSK-modulated signal during a corresponding event or window.

Operation as exemplified in the foregoing is intrinsically robust against any drifts in the carrier of the FSK-signal, due to the "differential" nature of detection (wherein period/frequency over a certain time window is compared with the period/frequency over a previous time window).

Also, the fact that each count gives an indication of an average period/frequency of the FSK-signal over a certain time window makes operation refractory to phase jumps as discussed in the introductory portion to this description and to possible misalignment of the start of the counting windows with the frequency transitions produced by the modulating signal.

In one or more embodiments, frequency changes of the FSK-modulated signal may be detected by timing the period of the $FSK_{in}$ signal by grouping a number n of the FSK-modulated waveforms/pulses in a same measurement, with the possibility of achieving a high sensitivity even to small frequency changes.

The number n of pulses grouped in each window may be rendered configurable, e.g., via the signal WS from the unit 120, thus making such sensitivity selectively adjustable.

For instance, in one or more embodiments as exemplified in FIG. 4 the window circuit 125 may be configured for receiving (e.g., from the unit 120) a window size signal WS (e.g., n) with the capability of enabling/disabling (start/stop signals) operation of the free running counter 126.

In one or more embodiments, the window circuit 125 may be configured for counting the pulses of the FSK-modulated incoming signal $FSK_{in}$ in order to identify the end of a current window while the free running counter 126 may be configured simply as a free running timer to time the duration of a window of n periods by counting the pulses of the clock signal clk fed thereto.

In one or more embodiments, the value reached by the free running timer 126 at the end of each window may represent an estimation of the input signal frequency.

In one or more embodiments, the frequency change detector 128 may be configured in order to compare the signals FRT val and Prev FRT val for each observation window to detect a frequency change, with the possibility, if the input frequency does not change, that operation may continue until a time out occurs.

As a function of the time measured by the counter/timer 126, e.g., as a result of the difference of the durations of two subsequent count windows being higher or lower than a difference threshold corresponding to the width D of the Dzone 2×D of FIG. 2) a frequency change/no frequency change condition may be detected and the respective information (signal FC) passed on to the bit decoding block 14.

One or more embodiments exemplified herein may thus operate by detecting frequency changes by comparing a currently received frequency with a previously received frequency and not, e.g., with a fixed calculated threshold.

As indicated, one or more embodiments may thus be insensitive to frequency shifts/drifts in the FSK-carrier. By operating on "large" windows (that is with high values for n) the possibility exist of detecting even slight differences between frequencies (e.g., f0 and f1) with the capability of achieving a good degree of accuracy even when the external clock clk is not particularly fast.

In one or more embodiments, the width D of the 2×D Dzone area of FIG. 2 may be programmable (e.g., via the unit 120) thus making it possible, e.g., for the user to "trim" the detector sensitivity, by taking into account, e.g., operating conditions such as noise level and so on.

The exemplary presentation provided in the foregoing refers for the sake of simplicity and ease of understanding the two-level FSK modulation ("0" and "1"), that is 2-FSK modulation of an FSK-modulated signal which may have two (nominal) frequencies f0 and f1.

As indicated, one or more embodiments may be applied to "multilevel" modulation. An exemplary case of such multilevel modulation may include, e.g., 4-FSK, that is an FSK-modulated signal which may have four different frequencies f0, f1, f2, f3 which may correspond to four possible bit combinations in a digital modulating signal, e.g., "00", "01", "10", "11". Extensions to higher levels such as 8-FSK, 16-FSK and so on are within the capability of the person skilled in the art.

Figure 5:
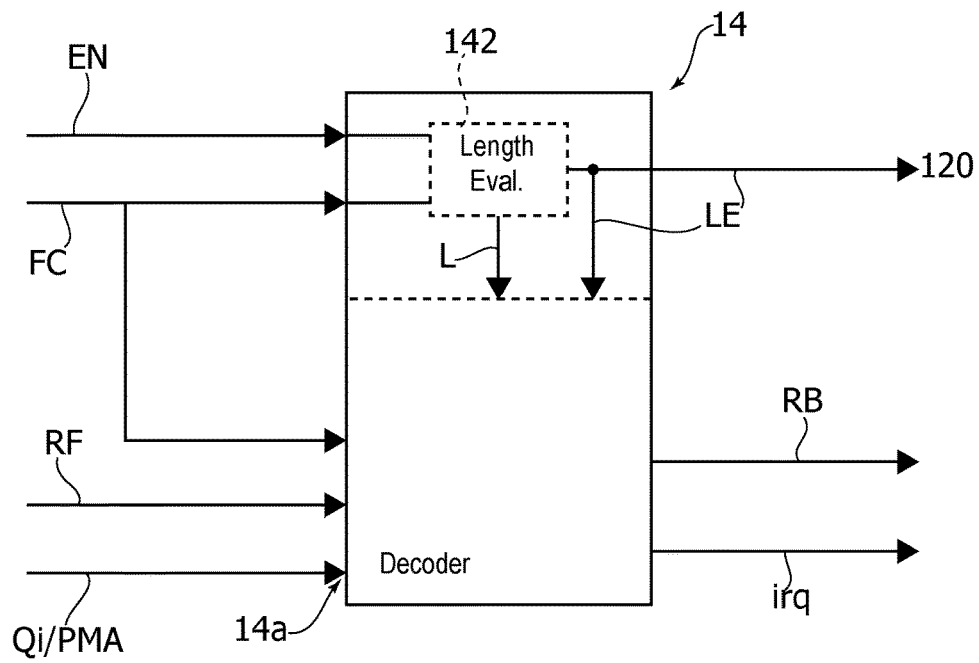
FIG. 5 is a block diagram exemplary of possible features of one or more embodiments.

In one or more embodiments as exemplified in FIG. 5, in addition to a signal (e.g., RF) indicative of a last measured frequency, the bit decoding block 14 may receive as an input also information as to the total number of "samples" (e.g., the number of pulses/waveforms of the input FSK-modulated signal) received at that frequency.

In one or more embodiments that information may be provided jointly by the change frequency signal FC provided by the frequency change detector 128 and the event number signal EN provided by the event counter 124 as possibly processed in a length evaluation (sub)module or circuit 142.

In one or more embodiments the module or circuit 142 may be configured in order to generate a length signal L which (e.g., in the case of decoding a Manchester-encoded signal) may be indicative of whether a frequency change occurred halfway of a transmitted bit, in order to understand if a "0" or a "1" was transmitted.

If a change (transition) occurs at an unexpected instant (e.g., due to an erroneous register configuration) and error signal LE (not visible in FIG. 4) may be activated and sent to the MPU unit 120

In that way, the FSK demodulator 10 may be configured for decoding the received bits by also taking into account specific modulation formats (e.g., Qi or PMA—these being just possible examples). Corresponding information (e.g., identifying a certain modulation format) may be provided to the decoding block 14, e.g., on user controllable input 14a.

For instance, in the case of Qi, the time elapsed between two changes in frequency may play a role in demodulating the received signal which is encoded (in a manner known per se) according to a differential bi-phase encoding scheme (e.g., with the two levels "0" and "1" represented by signals exhibiting no transitions or a transition half-way the bit period).

One or more embodiments may also provide the capability of decoding signals encoded with a Manchester code modulation scheme as may be the case, e.g., of MA 1-8 communication protocol.

In one or more embodiments, an interrupt may be generated, e.g., as a signal irq from the bit decoding circuit 14 to the processing unit (MPU) 120, e.g., when a certain bit is received.

For instance, the possibility may exist in one or more embodiments, of, e.g., using an internal buffer (such as the buffer 16 in FIG. 3) having a length of, e.g., 32 bits, of concatenating subsequent bits, with the possibility of configuring the number of bits which are accumulated in the buffer before an interrupt.

In one or more embodiments, a further time-out interrupt can be programmed to interrupt (e.g., only) the unit 120 when the transmission ends and the receiving line returns to idle. This may permit reception also in the case the length of a transmitted packet is not known in advance.

As indicated, one or more embodiments may be configured for reception of signals according to a Qi and/or a PMA protocol.

In the former case (Qi) a demodulator as the demodulator 10 of FIG. 3 may be configured in order to:

detect the frequency variations in the FSK-modulated input signal encoded with a by-phase coding,
 decode the received bits thus detected,
 receive a (programmed) number of bits and accumulate them within an internal buffer 16,
 interrupt the unit 120 (MPU) as a result of a desired number of bits having been stored in the buffer or in the case such a buffer is full.

In the case of PMA encoding (e.g., PMA Manchester encoding), a FSK-demodulator 10 as exemplified in FIG. 3 may be configured for:

demodulating the Manchester encoded signal as a function of the frequency variations in the input signal detected, and
 properly decoding Manchester-encoded received bits.

In one or more embodiments, a programmable time out feature as discussed in the foregoing may be provided (e.g., in the frequency change detection module 128) when the line over which the FSK-modulated signal is received goes back to idle.

Such a feature may simplify an application software instruction code as used, e.g., for bit decoding.

One or more embodiments may provide a hardware implementation for FSK-demodulation including a frequency change detection module (e.g., 128) sensitive to "differential" changes in the frequency of the FSK-modulated signal (e.g., instead of the absolute values thereof).

One or more embodiments may provide a bit decoding module capable of demodulating bi-phase and/or Manchester code modulated signals.

One or more embodiments may include a programmable time out feature (e.g., at the FSK-change detection level) in order to detect when the line over which the FSK-modulated signal is received goes to idle.

One or more embodiments may provide a method of detecting a FSK-modulated waveform wherein the period of the FSK-modulated waveform varies as a function of the level of a digital modulating signal (see, e.g., FIG. 1), the method including:
  counting (e.g., at 1000 in FIG. 6) the occurrence of a first set of n periods of the FSK-modulated waveform, said n periods of said FSK-modulated waveform in said first set having a first time duration,
  counting (e.g., at 1002) the occurrence of a second set of n periods of said FSK-modulated waveform, said n periods of said FSK-modulated waveform in said second set having a second time duration,
  detecting and comparing (e.g., at 1004) said first time duration and said second time duration, and
  detecting (e.g., 1006) a change in the frequency (e.g., FC) of said FSK-modulated waveform indicative of a change in the level of said digital modulating signal as a result of said comparison indicating a difference between said first time duration and said second time duration reaching a detection threshold (D).

In one or more embodiments said first set of n periods and said second set of n periods may be neighboring (e.g., subsequent) sets of periods in said FSK-modulated waveform.

One or more embodiments may include cyclically counting (e.g., at 1000, 1002) the occurrence of sets of n periods of said FSK-modulated waveform over subsequent time windows (see, e.g., the window counter circuit 125 and the counter 126) wherein:
  said first set of n periods includes a set of n periods of said FSK-modulated waveform during a current time window (e.g., FRT val), and
  said second set of n periods includes a set of n periods of said FSK-modulated waveform during a previous time window (e.g., Prev FRT val).

One or more embodiments may include making said number n of periods of said FSK-modulated waveform selectively adjustable (e.g., at 120).

One or more embodiments may include making said difference threshold (e.g., D in FIG. 2) selectively adjustable (e.g., at 120).

One or more embodiments may include recovering said digital modulating signal (e.g., at the bit decoding block 14) as a function of the changes in the frequency of said FSK-modulated waveform detected as a result of said comparison (e.g., 1004 in FIG. 6).

One or more embodiments may include buffering (e.g., at 16) the information bits conveyed by said recovered digital modulating signal.

One or more embodiments may include generating interrupt signals (e.g., irq) for at least partly discontinuing detection (e.g., by interrupting the unit 120) as a result of, e.g., any of:
  reception of said FSK-modulated waveform being discontinued, and/or
  the number of said buffered bits reaching a threshold value, and/or
  the buffered bits having filled a respective buffer.

One or more embodiments may relate to a circuit (e.g., 12) including:
  counting circuitry (e.g., 125, 126) configured for counting the occurrence of sets of n periods in a FSK-modulated waveform, wherein the period of said FSK-modulated waveform varies as a function of the level of a digital modulating signal, the counting circuitry configured to:
    i) counting (e.g., 1000) the occurrence of a first set of n periods of said FSK-modulated waveform, said n periods of said FSK-modulated waveform in said first set having a first time duration,
    ii) count (e.g., 1002) the occurrence of a second set of n periods of said FSK-modulated waveform, said n periods of said FSK-modulated waveform in said second set having a second time duration,
  a frequency change detection module (e.g., 128) coupled with said counting circuitry to receive therefrom at least one signal (e.g., FRT val, Prev FRT val) indicative of said first time duration and said second time duration, comparing (e.g., 1004) said first time duration and said second time duration and generating at least one detection signal (e.g., FC) indicative of the occurrence of variations in the frequency of said FSK-modulated waveform as a result of the difference between said first time duration and said second time duration reaching a detection threshold (e.g., D), wherein the circuit is configured for implementing the method of one or more embodiments.

One or more embodiments may relate to an FSK-demodulator (e.g., 10) including:
  a circuit (e.g., 12) according to one or more embodiments, and
  a bit decoding module (e.g., 14) coupled with said circuit to receive therefrom said at least one detection signal indicative of the occurrence of variations in the frequency of said FSK-modulated waveform, the bit decoding module configured for recovering from said at least one detection signal the information bits conveyed by said digital modulating signal.

One or more embodiments may include a buffer module (e.g., 16) for storing a plurality of information bits conveyed by said digital modulating signal recovered from said at least one detection signal.

On one or more embodiments said decoding module may be configured for decoding at least one of a differential by-phase encoded signal and a Manchester-encoded signal.

One or more embodiments may relate to a computer program product, loadable in the memory of at least one processing device and including software code portions for performing the method of one or more embodiments.

Without prejudice to the underlying principles, the details and embodiments may vary, even significantly, with respect to what has been described in the foregoing by way of example only, without departing from the extent of protection.

Some embodiments may take the form of or include computer program products. For example, according to one embodiment there is provided a computer readable medium including a computer program adapted to perform one or more of the methods or functions described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some of the systems and/or modules and/or circuits and/or blocks may be implemented or provided in other manners, such as at least partially in firmware and/or hardware, including, but not limited to, one or more application-specific integrated circuits (ASICs), digital signal processors, discrete circuitry, logic gates, standard integrated circuits, state machines, look-up tables, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
counting an occurrence of a first set of n periods of a frequency-shift-keying (FSK)-modulated waveform, where n is an integer number, said n periods of said FSK-modulated waveform in said first set having a first time duration, wherein a period of the FSK-modulated waveform varies as a function of a level of a digital modulation signal;
counting an occurrence of a second set of n periods of said FSK-modulated waveform, said n periods of said FSK-modulated waveform in said second set having a second time duration;
determining, based on the counting of the first set of n periods, the first time duration;
determining, based on the counting of the second set of n periods, the second time duration;
comparing a difference between said first time duration and said second time duration to a threshold; and
detecting a change in a frequency of said FSK-modulated waveform indicative of a change in the level of said digital modulating signal based on the comparing of the difference between the first time duration and the second time duration to the threshold, wherein:
the method comprises cyclically counting occurrences of sets of n periods of said FSK-modulated waveform over sequential time windows,
said first set of n periods includes a set of n periods of said FSK-modulated waveform during a current time window, and
said second set of n periods includes a set of n periods of said FSK-modulated waveform during a previous time window.

2. The method of claim 1 wherein said first set of n periods and said second set of n periods are neighboring sets of periods in said FSK-modulated waveform.

3. A method, comprising:
counting an occurrence of a first set of n periods of a frequency-shift-keying (FSK)-modulated waveform, where n is an integer number, said n periods of said FSK-modulated waveform in said first set having a first time duration, wherein a period of the FSK-modulated waveform varies as a function of a level of a digital modulation signal;
counting an occurrence of a second set of n periods of said FSK-modulated waveform, said n periods of said FSK-modulated waveform in said second set having a second time duration;
determining, based on the counting of the first set of n periods, the first time duration;
determining, based on the counting of the second set of n periods, the second time duration;
comparing a difference between said first time duration and said second time duration to a threshold; and
detecting a change in a frequency of said FSK-modulated waveform indicative of a change in the level of said digital modulating signal based on the comparing of the difference between the first time duration and the second time duration to the threshold, wherein the method comprises:
recovering said digital modulation signal as a function of detected changes in the frequency of said FSK-modulated waveform based on a series of comparisons of differences between durations of sets of n periods to the threshold;
detecting a discontinuation of reception of the FSK-modulated waveform; and
generating an interrupt signal in response to the detection of the discontinuation.

4. The method of claim 3, comprising:
cyclically counting occurrences of sets of n periods of said FSK-modulated waveform over sequential time windows wherein:
said first set of n periods includes a set of n periods of said FSK-modulated waveform during a current time window, and
said second set of n periods includes a set of n periods of said FSK-modulated waveform during a previous time window.

5. The method of claim 1, comprising:
adjusting said number n of periods of said FSK-modulated waveform.

6. The method of claim 1, comprising:
adjusting said threshold.

7. The method of claim 1, comprising:
recovering said digital modulation signal as a function of detected changes in the frequency of said FSK-modulated waveform based on a series of comparisons of differences between durations of sets of n periods to the threshold.

8. The method of claim 7, comprising:
buffering information bits of said recovered digital modulation signal.

9. A method, comprising:
counting an occurrence of a first set of n periods of a frequency-shift-keying (FSK)-modulated waveform, where n is an integer number, said n periods of said FSK-modulated waveform in said first set having a first time duration, wherein a period of the FSK-modulated waveform varies as a function of a level of a digital modulation signal;

counting an occurrence of a second set of n periods of said FSK-modulated waveform, said n periods of said FSK-modulated waveform in said second set having a second time duration;

determining, based on the counting of the first set of n periods, the first time duration;

determining, based on the counting of the second set of n periods, the second time duration;

comparing a difference between said first time duration and said second time duration to a threshold; and detecting a change in a frequency of said FSK-modulated waveform indicative of a change in the level of said digital modulating signal based on the comparing of the difference between the first time duration and the second time duration to the threshold, wherein the method comprises:

recovering said digital modulation signal as a function of detected changes in the frequency of said FSK-modulated waveform based on a series of comparisons of differences between durations of sets of n periods to the threshold;

buffering information bits of said recovered digital modulation signal; and generating an interrupt signal in response to at least one of:
a number of said buffered bits reaching a threshold number of bits; and
a buffer overflow.

10. A device, comprising:
one or more memories; and
frequency-shift detection circuitry, which, in operation:
counts occurrences of sets of n periods of a received frequency-shift-keying (FSK)-modulated waveform, where n is an integer number;
determines, based on the counting, time durations corresponding to respective sets of n periods;
compares differences between time durations corresponding to respective sets of n periods to a threshold difference; and
generates one or more signals indicative of variations in frequency of the FSK-modulated waveform based on the comparing of the differences between time durations to the threshold difference, wherein the frequency-shift detecting circuitry, in operation:
cyclically counts occurrences of sets of n periods of said FSK-modulated waveform over sequential time windows wherein:
a first set of n periods includes a set of n periods of said FSK-modulated waveform during a current time window;
a second set of n periods includes a set of n periods of said FSK-modulated waveform during a previous time window; and
a difference between a time duration corresponding to the first set of n periods and a time duration corresponding to the second set of n periods is compared to the threshold difference.

11. The device of claim 10 wherein the frequency-shift detecting circuitry, in operation, compares differences between time durations of neighboring sets of n periods in said FSK-modulated waveform to the threshold difference.

12. A device, comprising:
one or more memories; and
frequency-shift detection circuitry, which, in operation:
counts occurrences of sets of n periods of a received frequency-shift-keying (FSK)-modulated waveform, where n is an integer number;
determines, based on the counting, time durations corresponding to respective sets of n periods;
compares differences between time durations corresponding to respective sets of n periods to a threshold difference; and
generates one or more signals indicative of variations in frequency of the FSK-modulated waveform based on the comparing of the differences between time durations to the threshold difference, wherein the frequency-shift detecting circuitry, in operation:
detects discontinuations of reception of the FSK-modulated waveform; and
generates an interrupt signal in response to detection of a discontinuation.

13. The device of claim 12 wherein the frequency-shift detecting circuitry, in operation:
cyclically counts occurrences of sets of n periods of said FSK-modulated waveform over sequential time windows wherein:
a first set of n periods includes a set of n periods of said FSK-modulated waveform during a current time window;
a second set of n periods includes a set of n periods of said FSK-modulated waveform during a previous time window; and
a difference between a time duration corresponding to the first set of n periods and a time duration corresponding to the second set of n periods is compared to the threshold difference.

14. The device of claim 10 wherein n is adjustable.

15. The device of claim 10 wherein the threshold difference is adjustable.

16. The device of claim 10, comprising:
decoding circuitry, which, in operation, recovers a digital modulation signal based on the one or more signals indicative of variations in frequency of the FSK-modulated waveform generated in response to a series of comparisons of differences between durations corresponding to sets of n periods to the threshold difference.

17. The device of claim 10, wherein the frequency-shift detecting circuitry, in operation, recovers a digital modulation signal based on the one or more signals indicative of variations in frequency of the FSK-modulated waveform generated in response to a series of comparisons of differences between durations corresponding to sets of n periods to the threshold difference.

18. The device of claim 17 wherein the one or more memories comprise a buffer, which, in operation, buffers information bits of said recovered digital modulation signal.

19. The device of claim 18 wherein the frequency-shift detecting circuitry, in operation, generates an interrupt signal in response to at least one of:
a number of said buffered bits reaching a threshold number of bits; and
a buffer overflow.

20. A system, comprising:
receiving circuitry, which, in operation:
counts occurrences of sets of n periods of a received frequency-shift-keying (FSK)-modulated waveform, where n is an integer number;

determines, based on the counting, time durations corresponding to respective sets of n periods;

compares differences between time durations corresponding to respective sets of n periods to a threshold difference; and generates one or more signals indicative of variations in frequency of the FSK-modulated waveform based on the comparing of the differences between time durations to the threshold difference; and decoding circuitry, which, in operation, recovers a digital modulation signal based on the one or more signals indicative of variations in frequency of the FSK-modulated waveform generated in response to a series of comparisons of differences between durations corresponding to sets of n periods to the threshold difference, wherein the decoding circuitry, in operation, decodes at least one of a differential by-phase encoded signal and a Manchester-encoded signal.

21. The system of claim 20, including a buffer, which, in operation, stores information bits of the recovered digital modulation signal.

22. A system, comprising:

receiving circuitry, which, in operation:

counts occurrences of sets of n periods of a received frequency-shift-keying (FSK)-modulated waveform, where n is an integer number;

determines, based on the counting, time durations corresponding to respective sets of n periods;

compares differences between time durations corresponding to respective sets of n periods to a threshold difference; and generates one or more signals indicative of variations in frequency of the FSK-modulated waveform based on the comparing of the differences between time durations to the threshold difference;

decoding circuitry, which, in operation, recovers a digital modulation signal based on the one or more signals indicative of variations in frequency of the FSK-modulated waveform generated in response to a series of comparisons of differences between durations corresponding to sets of n periods to the threshold difference; and power control circuitry, which, in operation, controls a charging process based on the recovered digital modulation signal.

23. The system of claim 22 wherein the decoding circuitry, in operation, decodes at least one of a differential by-phase encoded signal and a Manchester-encoded signal.

24. A non-transitory, computer-readable medium having contents which cause a signal processing circuit to perform a method, the method comprising:

counting occurrences of sets of n periods of a received frequency-shift-keying (FSK)-modulated waveform, where n is an integer number;

determining, based on the counting, time durations corresponding to respective sets of n periods;

comparing differences between time durations corresponding to respective sets of n periods to a threshold difference;

generating one or more signals indicative of variations in frequency of the FSK-modulated waveform based on the comparing of the differences between time durations to the threshold difference;

recovering a digital modulation signal based on the one or more signals indicative of variations in frequency of the FSK-modulated waveform generated in response to a series of comparisons of differences between durations corresponding to sets of n periods to the threshold difference; and controlling a charging process based on the recovered digital modulation signal.

25. The non-transitory, computer-readable medium of claim 24 wherein the signal processing circuit comprises one or more memories and one or more processing cores.

26. A non-transitory, computer-readable medium having contents which cause a signal processing circuit to perform a method, the method comprising:

counting an occurrence of a first set of n periods of a frequency-shift-keying (FSK)-modulated waveform, where n is an integer number, said n periods of said FSK-modulated waveform in said first set having a first time duration, wherein a period of the FSK-modulated waveform varies as a function of a level of a digital modulation signal;

counting an occurrence of a second set of n periods of said FSK-modulated waveform, said n periods of said FSK-modulated waveform in said second set having a second time duration;

determining, based on the counting of the first set of n periods, the first time duration;

determining, based on the counting of the second set of n periods, the second time duration;

comparing a difference between said first time duration and said second time duration to a threshold; and detecting a change in a frequency of said FSK-modulated waveform indicative of a change in the level of said digital modulating signal based on the comparing of the difference between the first time duration and the second time duration to the threshold, wherein:

the method comprises cyclically counting occurrences of sets of n periods of said FSK-modulated waveform over sequential time windows, said first set of n periods includes a set of n periods of said FSK-modulated waveform during a current time window, and said second set of n periods includes a set of n periods of said FSK-modulated waveform during a previous time window.

* * * * *